(12) United States Patent
Trautmann et al.

(10) Patent No.: US 8,638,000 B2
(45) Date of Patent: Jan. 28, 2014

(54) MICROMECHANICAL METHOD AND CORRESPONDING ASSEMBLY FOR BONDING SEMICONDUCTOR SUBSTRATES AND CORRESPONDINGLY BONDED SEMICONDUCTOR CHIP

(75) Inventors: Achim Trautmann, Leonberg (DE); Ralf Reichenbach, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/509,163

(22) PCT Filed: Sep. 23, 2010

(86) PCT No.: PCT/EP2010/064009
§ 371 (c)(1),
(2), (4) Date: Jul. 30, 2012

(87) PCT Pub. No.: WO2011/057850
PCT Pub. Date: May 19, 2011

(65) Prior Publication Data
US 2012/0280409 A1 Nov. 8, 2012

(30) Foreign Application Priority Data
Nov. 13, 2009 (DE) .......................... 10 2009 046 687

(51) Int. Cl.
*H01L 23/48* (2006.01)

(52) U.S. Cl.
USPC ........... 257/782; 257/684; 257/723; 257/730; 257/E23.01; 257/E23.02; 257/E21.211; 438/455

(58) Field of Classification Search
USPC .................. 257/687–734, 772–786, 684, 735, 257/E23.01, E21.211; 438/15, 16, 26, 51, 438/55, 64, 106, 124–127, 455
See application file for complete search history.

(56) References Cited

U.S. PATENT DOCUMENTS

| 2007/0048898 A1 | 3/2007 | Carlson et al. |
| 2008/0067652 A1 | 3/2008 | Menard et al. |
| 2008/0283991 A1 * | 11/2008 | Reinert ......................... 257/685 |

FOREIGN PATENT DOCUMENTS

| EP | 1 720 204 A1 | 11/2006 |
| EP | 1 921 662 A1 | 5/2008 |
| WO | 2005008772 A2 | 1/2005 |

OTHER PUBLICATIONS

International Search Report corresponding to PCT Application No. PCT/EP2010/064009, mailed May 12, 2011 (German and English language document) (7 pages).

* cited by examiner

Primary Examiner — Jasmine Clark
(74) Attorney, Agent, or Firm — Maginot, Moore & Beck

(57) ABSTRACT

A micromechanical assembly for bonding semiconductor substrates includes a semiconductor substrate having a chip pattern having a plurality of semiconductor chips, each having a functional region and an edge region surrounding the functional region. There is a bonding frame made of a bonding alloy made from at least two alloy components in the edge region, spaced apart from the functional region. Within the part of the edge region surrounding the bonding frame between the bonding frame and the functional region, there is at least one stop frame made of at least one of the alloy components, which is configured such that when a melt of the bond alloy contacts the stop frame during bonding, the bonding alloy solidifies.

11 Claims, 3 Drawing Sheets

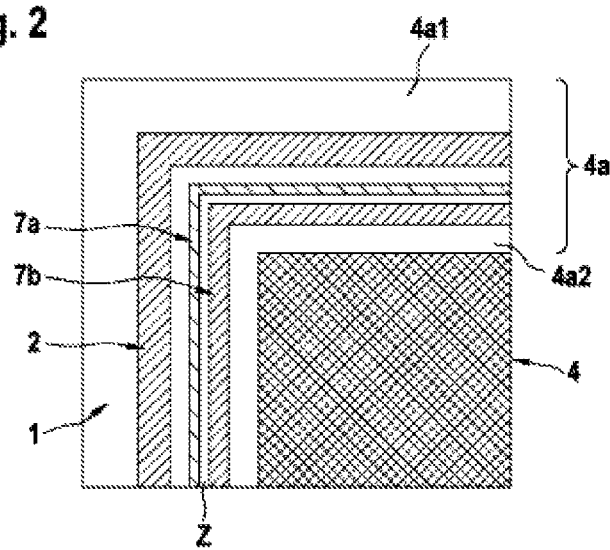
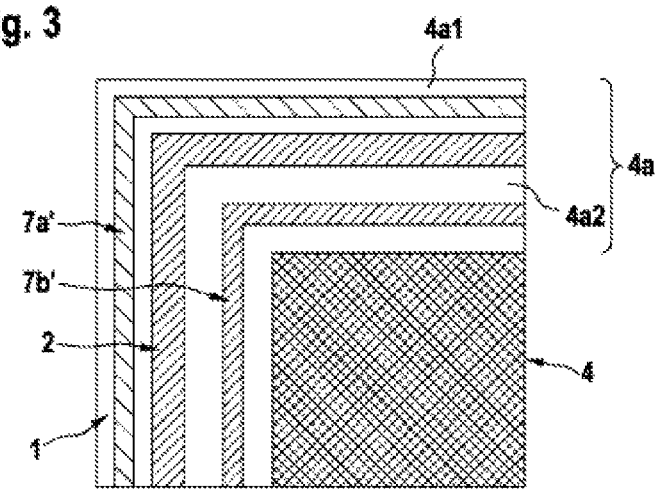

MICROMECHANICAL METHOD AND CORRESPONDING ASSEMBLY FOR BONDING SEMICONDUCTOR SUBSTRATES AND CORRESPONDINGLY BONDED SEMICONDUCTOR CHIP

This application is a 35 U.S.C. §371 National Stage Application of PCT/EP2010/064009, filed on Sep. 23, 2010, which claims the benefit of priority to Serial No. DE 10 2009 046 687.8, filed on Nov. 13, 2009 in Germany, the disclosures of which are incorporated herein by reference in their entirety.

BACKGROUND

The present disclosure relates to a micromechanical method and a corresponding assembly for bonding semiconductor substrates and a corresponding bonded semiconductor chip.

Although applicable to any micromechanical components and structures, in particular sensors and actuators, the present disclosure and the problem area addressed thereby will be explained with regard to a micromechanical sensor that can be produced using the technology of silicon surface micromachining.

Micromechanical substrate connections, e.g. wafer-wafer bonding connections, are usually realized by eutectic alloys comprising two or more solid bonding materials or alloy components as constituents. Eutectic alloys of this type have an unambiguously determinable melting point. By contrast, other mixing ratios with the same alloy components have a melting or solidification range in which, alongside the melt, a solid phase is also present. The melting point of the eutectic alloy is, moreover, the lowest of all mixtures composed of the same constituents.

During the bonding process, a minimum required bonding force has to be applied in order to bring the bonding alloys into contact at the wafer level. This causes the liquid eutectic phase to flow. In this case, it can happen that the liquid eutectic phase flows into MEMS functional regions in an uncontrolled manner. In order to minimize or prevent such flowing, it is possible to provide, for example, a very wide stop trench in each case on the inside and outside around the bonding frame, as a result of which an increased area requirement at the chip level has to be kept available.

FIG. 5 is a schematic partial plan view of a chip region of an exemplary assembly for bonding semiconductor substrates.

The micromechanical sensor chip 1, which has an active functional region 4 and a passive edge region 4a. Provided in the edge region 4a is a bonding frame 2 with an applied eutectic bonding alloy, for example Al—Ge, which divides the edge region 4a into an inner region 4a2, which is surrounded by the bonding frame, and an outer region 4a1. A stop trench 3 lies in the inner region 4a2 between bonding frame 2 and functional region 4 of the sensor chip 1, said stop trench being intended to prevent melt from flowing from the region of the bonding frame 2 into the functional region 4 during the bonding process. The part of the melt flowing during the bonding process is therefore intercepted by the use of the stop trench 3. Typical dimensions of such a stop trench 3 are between 20 and 50 µm in terms of the width b. Said stop trench 3 additionally requires both a minimum distance d1 with respect to the bonding frame 2 and a minimum distance d2 with respect to the active functional region 4. As a result, an inconsiderable area requirement is necessary precisely in the case of sensor chips that are becoming ever smaller.

WO 2005/008772 A2 discloses an electronic component comprising a semiconductor chip and a lead frame having a metal coating pattern on its underside for the soldering of the electronic component. Said metal coating pattern has wetting regions, which can be wetted with solder material, and anti-wetting regions, which cannot be wetted with solder material, wherein the electronic component has solder deposits on the wetting regions on the underside.

SUMMARY

The assembly according to the disclosure and the micromechanical method for bonding semiconductor substrates and the corresponding bonded semiconductor chip have the advantage that, as a result of the introduction of a comparatively small structured stop frame composed of at least one of the alloy components, at least within and preferably within and outside the actual bonding frame, the flowing melt is stopped.

The stop frame composed of at least one of the alloy components can be embodied, independently of the lithography and patterning processes used, with a width of between 0.1 and 50 µm, preferably between 1 and 20 µm, and particularly preferably between 5 and 10 µm, and thus constitutes a significantly smaller area requirement in comparison with the stop trenches. The distance with respect to the bonding frame and with respect to the functional region of the sensor can be made significantly smaller in comparison with the stop trenches, preferably between 1 and 20 µm and particularly preferably between 5 and 10 µm.

The concept on which the present disclosure is based consists in providing a compensation structure composed of at least one of the alloy materials for in-situ solidification of the liquid phase. The underlying mechanism is that the melt solidifies upon contact with the additionally provided material of the alloy component since the new composition has a higher melting point, e.g. the eutectic composition, is no longer provided, and, consequently, no further flowing is possible.

Preferably, the bonding alloy consists of one of the following mixtures: Au—Si, Al—Ge, Cu—Sn, Au—In and alloys composed of the respective individual materials under consideration, such as e.g. AlSiCu—GE, AlSi—Ge or AlCu—Ge. All alloying partners that can be used in micromechanics are conceivable, in principle.

Alloying partners whose phase diagrams provide a eutectic alloy are particularly preferred. One exemplary alloy is Al—Ge. The melting points of the two bonding materials are 660° C. for pure aluminum and 938° C. for pure germanium. The melting point at the eutectic point is 420° C. During eutectic bonding, the critical bonding temperature required for bonding is dependent on the mixture of the materials used. In the ideal case, a liquid phase forms at the melting point at the eutectic point. In the exemplary case of the Al—Ge alloy, the actual bonding temperature is usually in the range of 420° C. to 450° C.

Furthermore, the stop structures according to the disclosure also do not result in the production of an unnecessarily high topography, such as e.g. as a result of a stop trench.

Advantageous developments and improvements of the respective subject matter of the disclosure are found in the dependent claims.

BRIEF DESCRIPTION OF THE DRAWINGS

Exemplary embodiments of the disclosure are illustrated in the drawing and explained in greater detail in the following description.

In the figures:

FIG. 2 shows a schematic partial plan view of a chip region of an assembly for bonding semiconductor substrates in accordance with a second embodiment of the present disclosure;

FIG. 3 shows a schematic partial plan view of a chip region of an assembly for bonding semiconductor substrates in accordance with a third embodiment of the present disclosure;

DETAILED DESCRIPTION

In the figures, identical reference symbols designate identical or functionally identical parts.

Figure 1A:
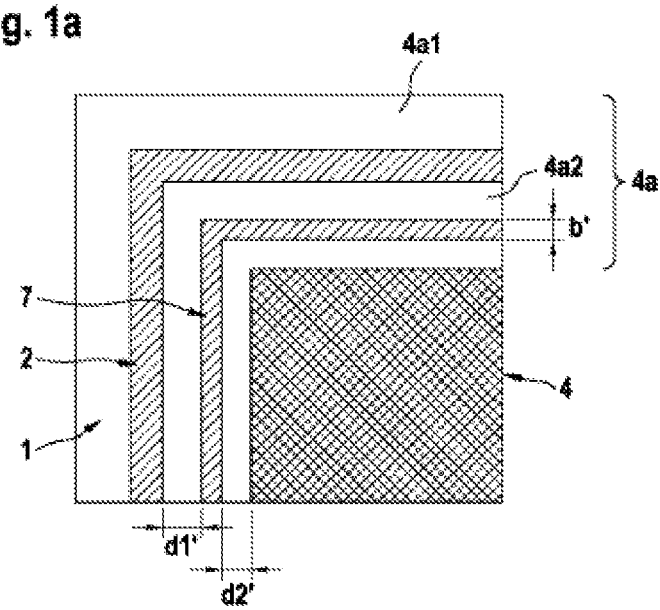
FIG. 1a shows a schematic partial plan view of a chip region of an assembly for bonding semiconductor substrates in accordance with a first embodiment of the present disclosure.

FIG. 1a is a schematic partial plan view of a chip region of an assembly for bonding semiconductor substrates in accordance with a first embodiment of the present disclosure.

The micromechanical sensor chip 1, which has an active functional region 4 and a passive edge region 4a. Provided in the edge region 4a is a bonding frame 2 with an applied eutectic bonding alloy, for example Al—Ge, which splits the edge region 4a into an inner region 4a2, which is surrounded by the bonding frame, and an outer region 4a1. A stop frame 7 is arranged in the inner region 4a2 between bonding frame 2 and functional region 4 of the sensor chip 1, said stop frame consisting of a non-eutectic alloy composed of Al and Ge, that is to say having either a higher Ge content or a higher Al content (up to the respective pure alloy component) than the corresponding eutectic alloy.

This additionally provided stop frame 7, upon contact with the flow movement (proceeding from the bonding frame 2) of the eutectic melt produced, leads to a change in the solubility of the bonding alloy and alters the material composition of the melt in such a way that the melt solidifies instantaneously and cannot flow further.

The stop frame 7 can be embodied, independently of the lithography and patterning processes used, with a width of between 0.1 and 50 µm, preferably between 1 and 20 µm, and particularly preferably between 5 and 10 µm, and, consequently, constitutes a significantly smaller area requirement in comparison with the stop trenches, which is designated as width b' in FIG. 1a. The distance d1' with respect to the bonding frame and the distance d2' with respect to the functional region of the sensor can be made significantly smaller in comparison with the stop trenches mentioned above, preferably between 1 and 20 µm and particularly preferably between 5 and 10 µm.

Figure 1B:
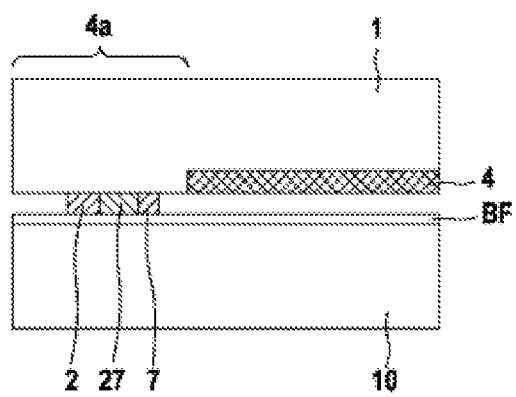
FIG. 1b shows a schematic partial cross-sectional view of a bonded chip manufactured from the assembly for bonding semiconductor substrates in accordance with the first embodiment of the present disclosure.

FIG. 1b is a schematic partial cross-sectional view of a bonded chip manufactured from the assembly for bonding of semiconductor substrates in accordance with the first embodiment of the present disclosure.

The bonded semiconductor chip has a first chip half 1 having a chip in accordance with FIG. 1, and furthermore a second chip half 10, which has a bonding surface BF, onto which the bonding frame 2 is bonded. There is a region 7 of solidified bonding alloy, which runs between the bonding frame 2 and stop frame 7, in which the stop frame 7 has intercepted the melt flowing during the bonding process.

FIG. 2 is a schematic partial plan view of a chip region of an assembly for bonding semiconductor substrates in accordance with a second embodiment of the present disclosure.

In the case of the second embodiment in accordance with FIG. 2, a double stop frame 7a, 7b with an interspace Z situated between the two stop frames 7a, 7b is provided. In the case of this second embodiment, in addition to altering the mixing ratio of the alloy out of the eutectic range, it is possible to utilize the capillary effect that forms between the two stop frames 7a, 7b, which are led in a parallel fashion, in the interspace Z. As a result of this capillary effect, relatively large amounts of a eutectic melt which occur locally can be rapidly distributed along the stop frames 7a, 7b by way of the interspace Z. This rapid distribution provides for the supply of a substantial amount of contact with the material of the stop frames, which accelerates the solidification, in order thus to be able to prevent even more effectively an "overflow" at a location greatly exposed to eutectic melt.

Otherwise, the second embodiment corresponds to the first embodiment.

FIG. 3 is a schematic partial plan view of a chip region of an assembly for bonding semiconductor substrates in accordance with a third embodiment of the present disclosure.

In the case of the third embodiment in accordance with FIG. 3, a respective stop frame 7a' and 7b' composed of a non-eutectic alloy or one of the alloy components are provided both outside the bonding frame 2 and within the bonding frame 2.

Otherwise, the third embodiment corresponds to the first and second embodiments.

Figure 4:
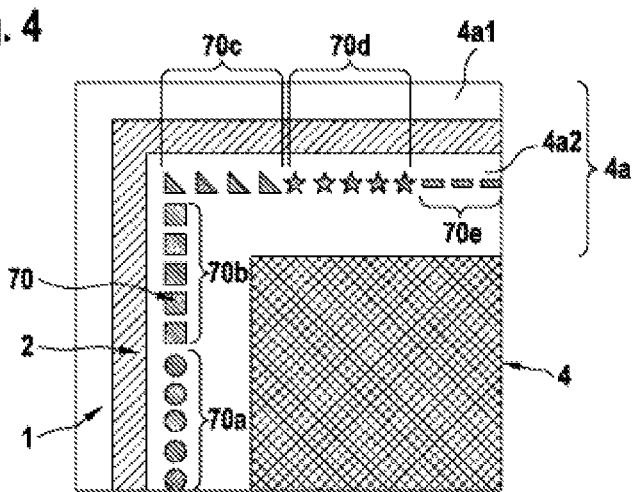
FIG. 4 shows a schematic partial plan view of a chip region of an assembly for bonding semiconductor substrates in accordance with a fourth embodiment of the present disclosure.
Figure 5:
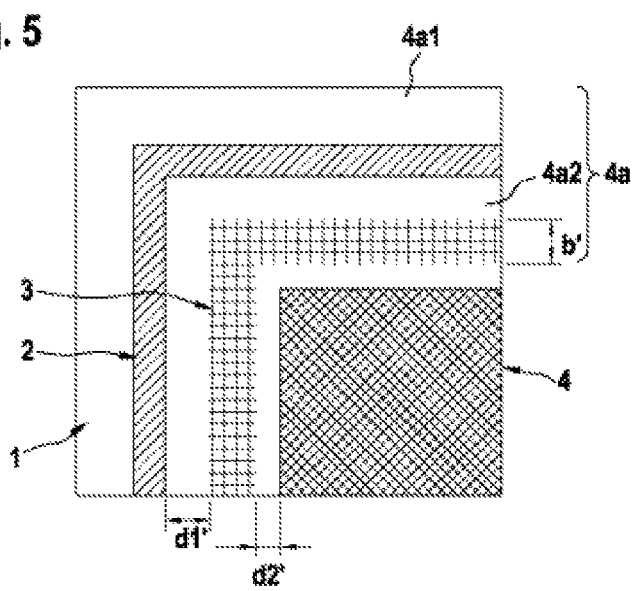
FIG. 5 shows a schematic partial plan view of a chip region of an exemplary assembly for bonding semiconductor substrates.

FIG. 4 is a schematic partial plan view of a chip region of an assembly for bonding semiconductor substrates in accordance with a fourth embodiment of the present disclosure.

In the case of the fourth embodiment in accordance with FIG. 4, examples are given of structures which can form a discontinuous stop frame, to be precise respectively by themselves or in combination with one another. The stop frame patterns comprise a point pattern 70a, a square pattern 70b, a triangle pattern 70c, a star pattern 70d and a line pattern 70e. It goes without saying that any other geometries are conceivable, where account should be taken of a width comparable to that in the case of a corresponding continuous stop frame and a distance d that is not so large, of typically 1 to 15 µm, between the individual structure elements.

Otherwise, the fourth embodiment corresponds to the first to third embodiments.

Although the present disclosure has been described above on the basis of preferred exemplary embodiments, it is not restricted thereto, but rather can be modified in diverse ways.

Although specific patterns and alloys have been specified in the above embodiments, the present disclosure is not restricted thereto, and it is possible, of course, to use patterns and alloys which deviate therefrom and which bring about the effect of the solidification of an overflowing melt.

Moreover, the disclosure is not restricted to eutectic mixtures, but rather can be applied to all alloys whose melting point can be increased by the addition of at least one of the alloy components.

The invention claimed is:

1. An assembly for bonding semiconductor substrates comprising:
   a semiconductor substrate having a chip pattern having a multiplicity of semiconductor chips each having a functional region and an edge region surrounding the functional region;
   a bonding frame composed of a bonding alloy composed of at least two alloy components and provided in the edge region at a distance from the functional region; and
   at least one stop frame composed of a frame alloy composed of at least one of the alloy components and provided within that part of the edge region which is surrounded by the bonding frame between the bonding frame and the functional region,
   wherein said frame alloy and said bonding alloy are different compositions such that, when a melt of the bonding alloy impinges on the stop frame during bonding, a mix alloy having a higher melting temperature than the bonding alloy is produced and the mix alloy solidifies.

2. The assembly as claimed in claim 1, wherein two stop frames each composed of at least one of the alloy components are provided between the bonding frame and the functional region, said stop frames running substantially parallel and forming an interspace.

3. The assembly as claimed in claim 1, further comprising:
   at least one further stop frame composed of a further frame alloy composed of at least one of the alloy components and provided in the edge region within that part of the edge region which is not surrounded by the bonding frame,
   wherein said further frame alloy and said bonding alloy have different compositions such that, when a melt of the bonding alloy impinges on the further stop frame during bonding, a further mix alloy having a higher melting temperature than the bonding alloy is produced and the further mix alloy solidifies.

4. The assembly as claimed in claim 1, wherein the bonding alloy has a eutectic composition.

5. The assembly as claimed in claim 1, wherein the bonding alloy consists of one of the following mixtures: Au—Si, Al—Ge, Cu—Sn, Au—In and alloys composed of the respective individual materials under consideration, including AlSiCu—Ge, AlSi—Ge or AlCu—Ge.

6. The assembly as claimed in claim 1, wherein the substrate is a semiconductor wafer.

7. An assembly for bonding semiconductor substrates comprising:
   a semiconductor substrate having a chip pattern having a multiplicity of semiconductor chips each having a functional region and an edge region surrounding the functional region;
   a bonding frame composed of a bonding alloy composed of at least two alloy components and provided in the edge region at a distance from the functional region; and
   at least one stop frame composed of at least one of the alloy components and provided within that part of the edge region which is surrounded by the bonding frame between the bonding frame and the functional region,
   wherein said at least one stop frame is configured in such a way that, when a melt of the bonding alloy impinges on the stop frame during bonding, solidification of the bonding alloy occurs, and
   wherein the bonding frame has a pattern structure composed of discrete pattern elements with a respective intermediate distance.

8. A micromechanical method for bonding semiconductor substrates comprising:
   heating an assembly above the melting point of a bonding alloy; and
   bonding the heated assembly on to a further semiconductor substrate under pressure,
   wherein the assembly includes (i) a semiconductor substrate having a chip pattern having a multiplicity of semiconductor chips each having a functional region and an edge region surrounding the functional region, (ii) a bonding frame composed of the bonding alloy composed of at least two alloy components and provided in the edge region at a distance from the functional region, and (iii) at least one stop frame composed of at least one of the alloy components and provided within that part of the edge region which is surrounded by the bonding frame between the bonding frame and the functional region,
   wherein said at least one stop frame is configured in such a way that, when a melt of the bonding alloy impinges on the stop frame during bonding, solidification of the bonding alloy occurs, and
   wherein part of the melt of the bonding alloy flows to the stop frame and solidifies there, without reaching the functional region.

9. The method as claimed in claim 8, wherein said stop frame is composed of an alloy that is different than said bonding alloy such that, when a melt of the bonding alloy impinges on the stop frame during bonding, a mix alloy having a higher melting temperature than the bonding alloy is produced and the mix alloy solidifies.

10. A bonded semiconductor chip comprising:
    a first chip half having a functional region and an edge region surrounding the functional region;
    a bonding frame composed of a bonding alloy composed of at least two alloy components and provided in the edge region at a distance from the functional region;
    at least one stop frame composed of a frame alloy composed of at least one of the alloy components and provided within that part of the edge region which is surrounded by the bonding frame between the bonding frame and the functional region,
    wherein said frame alloy and said bonding alloy are different compositions such that, when a melt of the bonding alloy impinges on the stop frame during bonding, a mix alloy having a higher melting temperature than the bonding alloy is produced and the mix alloy solidifies, and
    wherein a second chip half has a bonding surface, onto which the bonding frame is bonded.

11. The bonded semiconductor chip as claimed in claim 10, further comprising:
    a region of solidified mix alloy disposed between the bonding frame and stop frame.

* * * * *